(12) United States Patent
Apter (10) Patent No.: US 10,172,246 B2
(45) Date of Patent: Jan. 1, 2019

(54) UNIVERSAL MOUNT FOR A MOBILE HAND-HOLDABLE ELECTRONIC DEVICE

(71) Applicant: PADCASTER LLC, New York, NY (US)

(72) Inventor: Josh Apter, New York, NY (US)

(73) Assignee: PADCASTER LLC, New York, NY (US)

( * ) Notice: Subject to any disclaimer, the term of this patent is extended or adjusted under 35 U.S.C. 154(b) by 0 days.

(21) Appl. No.: 15/807,971

(22) Filed: Nov. 9, 2017

(65) Prior Publication Data
US 2018/0132364 A1 May 10, 2018

Related U.S. Application Data

(60) Provisional application No. 62/420,171, filed on Nov. 10, 2016.

(51) Int. Cl.
*H05K 5/00* (2006.01)
*F16B 2/12* (2006.01)
(Continued)

(52) U.S. Cl.
CPC ........ *H05K 5/0086* (2013.01); *B60R 11/0258* (2013.01); *F16B 2/12* (2013.01);
(Continued)

(58) Field of Classification Search
CPC ...... H05K 5/0086; H05K 5/0221; F16B 2/12; F16B 2/18
(Continued)

(56) References Cited

U.S. PATENT DOCUMENTS 5,903,645 A * 5/1999 Tsay .................... B60R 11/0241
248/316.4
6,229,893 B1 5/2001 Chen
(Continued)

FOREIGN PATENT DOCUMENTS

EP 2218611 A1 8/2010

OTHER PUBLICATIONS

Int'l Search Report and Written Opinion dated Feb. 6, 2018 in Int'l Application No. PCT/US2017/060837.

*Primary Examiner* — Anita M King
(74) *Attorney, Agent, or Firm* — Panitch Schwarze Belisario & Nadel LLP (57) ABSTRACT

A universal mount is able to accommodate mobile hand-holdable electronic devices of various sizes having a device lower edge spaced from a device upper edge. The universal mount has a housing sub-assembly having a housing sub-assembly base-plate with a lower mount attached thereto and configured to releaseably receive the device lower edge. A movable latch-plate sub-assembly, having an upper mount attached thereto, is disposed in and slideably attached to the housing sub-assembly. The upper mount, aligned with the lower mount at an adjustable position above and relative to the lower mount, is configured to releaseably receive the device upper edge. A support-plate sub-assembly is fixedly disposed in the housing. The movable latch-plate sub-assembly is slideably attached to the support-plate sub-assembly. A back-plate sub-assembly is attached to the housing sub-assembly and encloses the movable latch-plate sub-assembly and the support-plate sub-assembly in the housing sub-assembly.

8 Claims, 10 Drawing Sheets

(51) Int. Cl.
*F16B 2/18* (2006.01)
*H05K 5/02* (2006.01)
*B60R 11/02* (2006.01)
*F16M 11/04* (2006.01)
*F16M 13/02* (2006.01)

(52) U.S. Cl.
CPC ............. *F16B 2/18* (2013.01); *F16M 11/041* (2013.01); *F16M 13/022* (2013.01); *H05K 5/0221* (2013.01)

(58) Field of Classification Search
USPC ....................................................... 248/274.1
See application file for complete search history.

(56) References Cited

U.S. PATENT DOCUMENTS

| | | | |
|---|---|---|---|
| 6,959,899 B2 * | 11/2005 | Yeh ..................... | F16M 11/041 248/316.4 |
| 7,551,458 B2 * | 6/2009 | Carnevali ........... | B60R 11/0252 174/520 |
| 8,640,868 B2 | 2/2014 | O'Dowd et al. | |
| 9,103,487 B2 * | 8/2015 | Hale .................... | F16M 13/022 |
| 9,108,096 B2 * | 8/2015 | Solheim .............. | A63B 69/3632 |
| 9,386,194 B2 | 7/2016 | Basulto | |
| 9,581,180 B2 * | 2/2017 | Lien ........................ | F16B 2/10 |
| 9,586,530 B2 * | 3/2017 | Kim ....................... | B60R 11/02 |
| 9,695,977 B2 * | 7/2017 | Blalock ................ | F16M 13/022 |
| D794,606 S | 8/2017 | Zheng et al. | |
| 9,776,577 B2 * | 10/2017 | Carnevali ............... | B60R 11/02 |
| 9,840,264 B1 * | 12/2017 | Johnson ................ | B62B 3/1416 |
| 9,924,005 B1 * | 3/2018 | McElderry ............... | H04M 1/11 |
| 2004/0184223 A1 | 9/2004 | Yeh | |
| 2015/0359114 A1 * | 12/2015 | Yang ..................... | F16M 11/041 248/161 |
| 2016/0108942 A1 * | 4/2016 | Yu .......................... | F16M 13/00 248/316.4 |

* cited by examiner

UNIVERSAL MOUNT FOR A MOBILE HAND-HOLDABLE ELECTRONIC DEVICE

CROSS-REFERENCE TO RELATED APPLICATIONS

This application claims the benefit of priority under 35 USC § 119(e) of U.S. Provisional Patent Application No. 62/420,171 filed Nov. 10, 2016, the contents of which are incorporated herein by reference.

BACKGROUND OF THE INVENTION

The present invention generally relates to a mount for mounting therein a mobile hand-holdable electronic device. More particularly, the present invention relates to a universal mount with adjustable sub-assemblies for mounting therein differently-sized mobile hand-holdable electronic devices.

Mobile hand-holdable electronic devices are microprocessor-enabled electronic devices, which are generally small enough to be carried around by hand. Commonly used mobile hand-holdable devices include, but are not limited to, phones, tablets, Personal Digital Assistants (PDAs), cameras, gaming devices, personal navigation devices, audio players, and multimedia players. There are millions of mobile hand-holdable electronic devices in various sizes which are used in the world today.

Regardless of their size, most mobile hand-holdable electronic devices include a digital camera system. Digital camera systems integrated into mobile hand-holdable electronic devices have vastly improved in both image quality and editing features. The improvements are such that many mobile hand-holdable electronic devices take photographs as well as a traditional camera. But unlike traditional cameras, most mobile hand-holdable electronic devices do not include a receiving port or a similar coupling that allows the mobile hand-holdable electronic device to releasably received and retained in a mount. Thus, users often have to manually hold their mobile device, making it difficult to capture steady images and/or video. Most mobile hand-holdable electronic devices also do not include ports or cold shoe mounts suitable for connection to camera accessories (e.g. external lights, microphones, and the like) which enhance functionality of the device.

As such, there are clear needs for a universal mount that can accommodate differently sized mobile hand-holdable electronic devices.

BRIEF SUMMARY OF THE INVENTION

Briefly stated, one embodiment of the present invention is directed to a universal mount able to accommodate mobile hand-holdable electronic devices of various sizes having a device lower edge spaced from a device upper edge. The universal mount comprises a housing sub-assembly having a housing sub-assembly base-plate with a lower mount attached thereto. The lower mount is configured to releaseably receive the device lower edge. A movable latch-plate sub-assembly is disposed in and slideably attached to the housing sub-assembly. The movable latch-plate sub-assembly has an upper mount attached thereto. The upper mount is aligned with the lower mount at a position above the lower mount and is configured to releaseably receive the device upper edge. The position of the upper mount is adjustable relative to the lower mount to accommodate mobile hand-holdable electronic devices of various sizes. A support-plate sub-assembly is fixedly disposed in the housing. The movable latch-plate sub-assembly is slideably attached to the support-plate sub-assembly. A back-plate sub-assembly is attached to the housing sub-assembly and encloses the movable latch-plate sub-assembly and the support-plate sub-assembly in the housing sub-assembly.

BRIEF DESCRIPTION OF THE SEVERAL VIEWS OF THE DRAWINGS

The following detailed description of a preferred embodiment of the invention will be better understood when read in conjunction with the appended drawings. For the purpose of illustrating the invention, there is shown in the drawings an embodiment which is presently preferred. It should be understood, however, that the invention is not limited to the precise arrangement and instrumentalities shown.

In the drawings.

DETAILED DESCRIPTION OF THE INVENTION

Reference will now be made in detail to an embodiment of the invention, an example of which is illustrated in the accompanying drawings. The terminology used in the description of the invention herein is for the purpose of describing the preferred embodiment only and is not intended to be limiting of the invention.

As used in the description of the invention and the appended claims, the singular forms "a", "an" and "the" are intended to include the plural forms as well, unless the context clearly indicates otherwise. The words "and/or" as used herein refers to and encompasses any and all possible combinations of one or more of the associated listed items. The words "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The words "right," "left," "lower", "upper", 'rearward' and "forward" designate directions in the drawings to which reference is made. The words "inwardly" and "outwardly" refer to directions toward and away from, respectively, the geometric center of the embodiment, and designated parts thereof. The terminology includes the words noted above, derivatives thereof and words of similar import.

Although the words first, second, etc., are used herein to describe various elements, these elements should not be limited by these words. These words are only used to distinguish one element from another. For example, a first length could be termed a second length, and, similarly, a second length could be termed a first length, without departing from the scope of the present invention.

The following description is directed towards various embodiments of the universal mount for a mobile hand-holdable electronic device in accordance with the present invention.

Referring to the drawings in detail, where like numerals indicate like elements throughout, there is shown in FIGS. 1-24 a first preferred embodiment of a universal mount for a mobile hand-holdable electronic device, generally designated 10, and hereinafter referred to as the "mount" 10 in accordance with the present invention. The mount 10 releaseably retains therein a mobile hand-holdable electronic device such as a tablet computer, cell phone, camera and the like.

Figure 8:
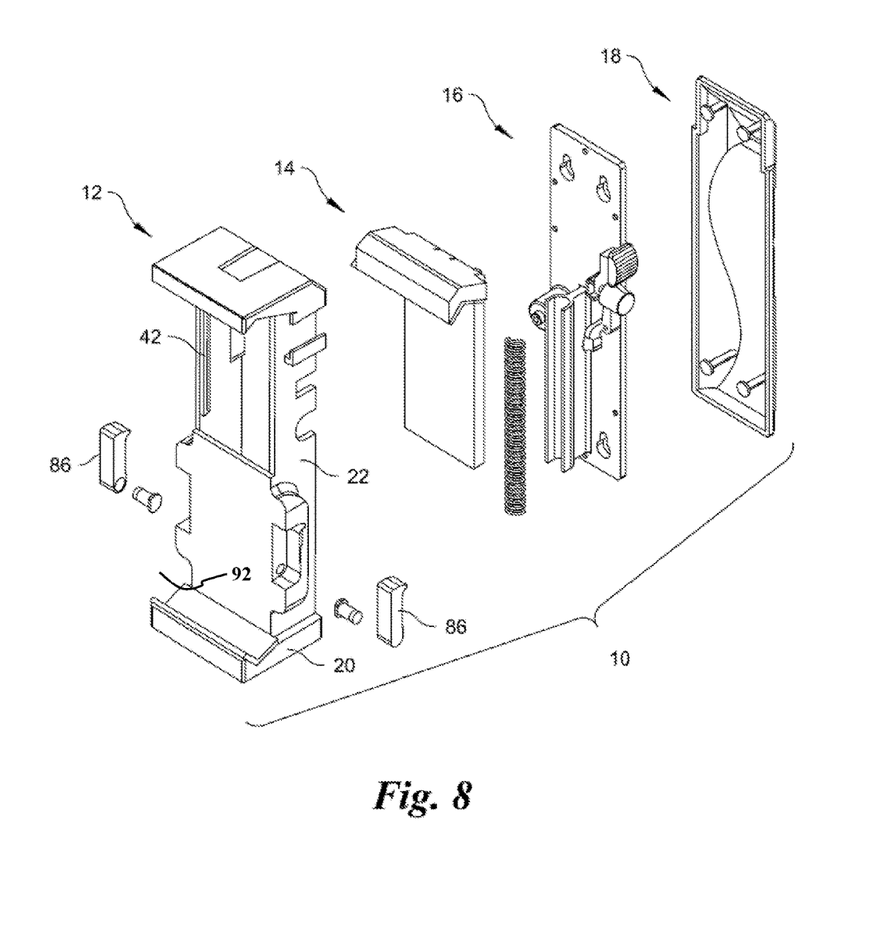
FIG. 8 is a partially exploded front isometric view of the mount of FIG. 1.

Referring to the exploded front isometric view in FIG. 8, the mount 10 comprises a housing sub-assembly 12 within which a movable-plate sub-assembly 14 and a support-plate sub-assemble 16 to which the movable latch-plate sub-assembly 14 is slideably attached are disposed and enclosed therein by a back-plate sub-assembly 18 attached to the housing sub-assembly 12.

Referring to FIGS. 1-8, the housing sub-assembly 12 preferably has a generally rectangular housing base-plate 20 from which spaced-apart right (or first) and left (or second) housing side-plates 22, 24 having a length $L_1$ extend upwardly to a housing top-plate 26. For mobile hand-holdable electronic devices, such as cell phones, $L_1$ may be between four to eight inches, but could be larger than eight inches or smaller than four inches. For mobile hand-holdable electronic devices, such as pads or tablets, $L_1$ may be between eight to twelve inches but could be greater than 12 inches or less than eight inches.

A housing front-plate 28 extending from the right housing side-plate 22 to the left housing side-plate 24 has a housing front-plate lower edge 28a spaced from a housing base-plate front lip 30 and extends upwardly from the housing base-plate 20 a length $L_2$ terminating in a housing front-plate upper edge 28b. The remaining front portion of the housing sub-assembly 12 between the housing top-plate 26 and the housing front-plate upper edge 28b provides and opening having a length $L_3$ within which the position of the movable-plate sub-assembly 14 is adjusted to accommodate mobile hand-holdable electronic devices of various sizes. The multi-plate housing sub-assembly 12 is preferably injection molded as a single integrated piece. However, the multi-plate housing sub-assembly 12 may assembled from individually fabricated pieces joined together by well known material specific joining methods, such as adhesive bonding if the fabrication material is a polymeric material, conventional welding if the fabrication material is a metal of by any number of well known fasteners. Although the piece-parts comprising the housing sub-assembly 12 have been referred to as plates, in some instances, the plates need not be planar and could have a shell-like curvature.

The housing base-plate 20 is not limited to a rectangular shape and in some embodiments may have another geometric shape such as a square or any other polygon. In some embodiments the right and left housing base-plate side-walls 32, 34 may be extensions of the lower portion of the right and left housing side-plates 22, 24. In other embodiments, the lower portion of the right and left housing side-plates 22 may be contained within the right and left housing base-plate side-walls 32, 34.

A lower mount 36 configured to releaseably support and retain a portion of a lower edge of a mobile hand-holdable electronic device is fixedly attached to the front portion of the housing base-plate 20 between the housing base-plate front lip 30 and the housing front-plate lower edge 28a. Preferably, the lower mount 36 has a V-shaped cross-section compatible with the lower edge of mobile hand-holdable electronic devices with a wide variety of configurations. In some embodiments, the lower mount 36 is not fixedly attached to the housing base-plate 20 and may be replaced by a base-plate tailored to the configuration of the lower edge of a particular mobile hand-holdable electronic device.

Referring to FIGS. 8 and 15-18, the movable latch-plate sub-assembly 14 includes a movable plate 38 slideably disposed within and attached to the housing sub-assembly 12 by latch pins 40 (see, FIG. 17) that extend outwardly from each side of the top portion of the movable plate 38 and engage slots 42 (see FIG. 8) in the opposed inner surfaces of the right and left housing side-plates 22, 24 adjacent the opening above the upper edge 28b of the housing front-plate 28. A cantilevered brace 44 attached to the top of the movable plate 38 extends forward through the opening in the housing sub-assembly 12. The brace 44 has a generally rectangular shape extending the width of the movable plate 38 and has a V-shaped cross section for receiving and fixedly retaining an upper mount 46 having a configuration compatible with the upper edge of mobile hand-holdable electronic devices with a wide variety of configurations. In some embodiments, the upper mount 46 may not be fixedly attached to the brace 44 and may be replaceable with an upper mount tailored to the configuration of a particular mobile hand-holdable electronic device.

Figure 21:
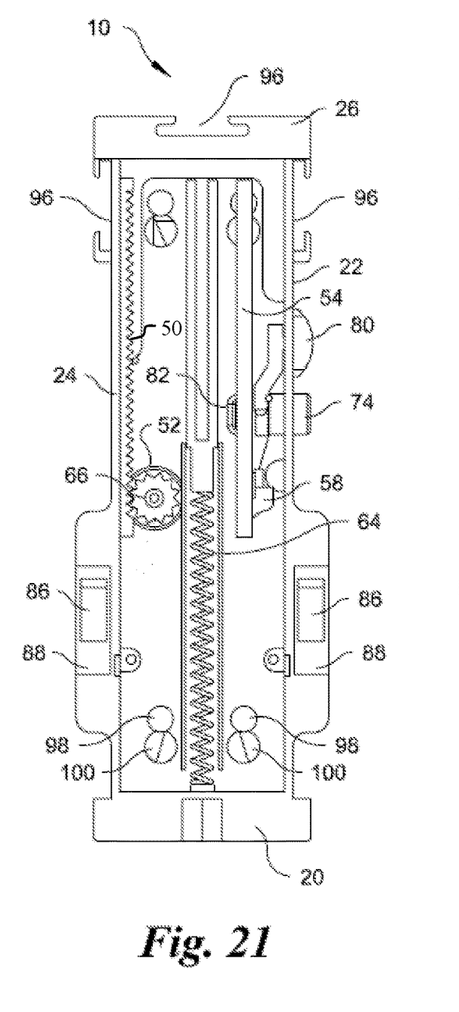
FIG. 21 is a cross-sectional elevation view of the mount of FIG. 1 taken along the line B-B of FIG. 6.

Referring to FIGS. 16-18, 21 and 22, a latch-plate sub-assembly rail 48 functioning as a rack is positioned along the right edge of the rearwardly facing surface of the latch-plate sub-assembly 14, extends rearwardly and has gear teeth 50 on an inwardly facing surface for engaging a gear wheel 52 (see, FIG. 21). A latch-plate sub-assembly bar 54 functioning as a ratchet bar is spaced from the left edge of the rearwardly facing surface of the latch-plate sub-assembly 14, extends rearwardly and has serrated teeth 56 on an outwardly facing surface for engaging a pawl 58 (See, FIGS.

Figure 22:
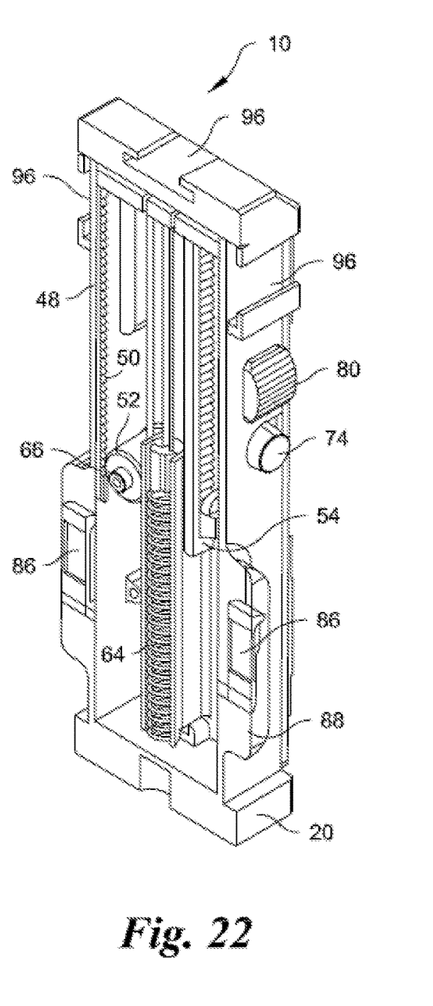
FIG. 22 is a front isometric cross-sectional elevation view of the mount of FIG. 1 taken along the line A-A of FIG. 1.
Figure 23:
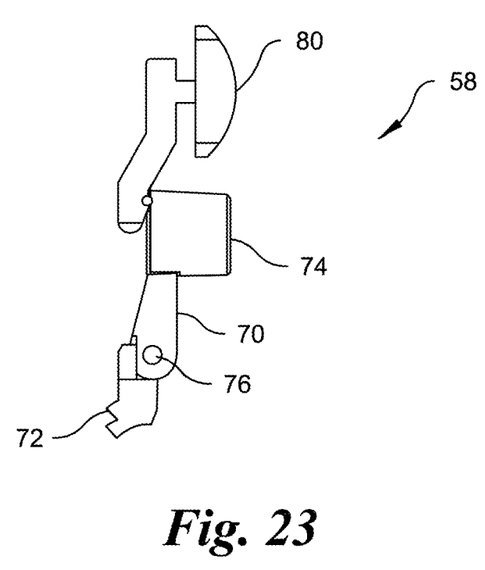
FIG. 23 is a right side elevation view of the pawl of the mount of FIG. 1.
Figure 24:
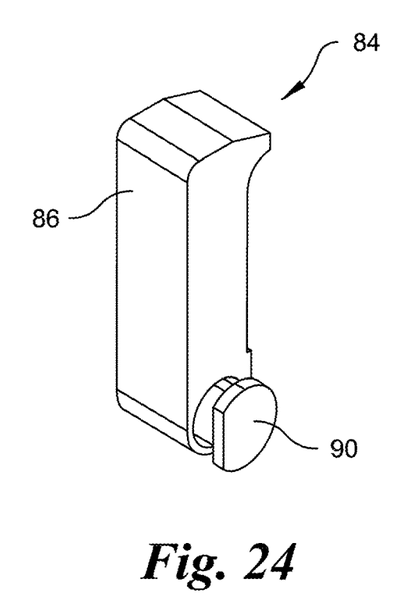
FIG. 24 is front isometric view of the right-side intermediate mount of the mount of FIG. 1.

21-23) permitting movement of the movable latch-plate sub-assembly 14 in one direction and preventing movement in the opposite direction.

A movable latch-plate sub-assembly channel 60 between the rail 48 and the bar 54 is centrally positioned on the rearwardly facing surface of the latch-plate sub-assembly 14. A rod 62 extending substantially the length of the latch-plate sub-assembly channel 60 terminates in an open end 62a configured to receive one end of a movable latch-plate sub-assembly compression spring 64 (See, FIGS. 21 and 22) The other end of the latch-plate sub-assembly compression spring 64 is attached to and supported by the housing base plate 20.

Referring to FIGS. 8, 11-14, 21 and 22, the support-plate sub-assembly 16 is operatively coupled to the movable latch-plate sub-assembly 14 by (i) the support-plate sub-assembly gear wheel 52 rotatably mounted on a inwardly extending support-plate sub-assembly shaft 66 on the forwardly facing surface of the support-plate sub-assembly 16 and which engages the rail 48 on the rearwardly facing surface of the latch-plate sub-assembly 14, (ii) the support-plate sub-assembly pawl 58 which engages the ratchet bar 54 on the rearwardly facing surface of the latch-plate sub-assembly 14, and (iii) a support-plate sub-assembly channel 68 within which the latch-plate sub-assembly channel 60 is movable. The movable latch-plate sub-assembly 14 compression spring 64 upwardly biases the upper mount 46 away from the lower mount 36.

Referring to FIGS. 8 and 21-23, the pawl 58 comprises a pivoting catch 70 having an catch edge 72 at one end configured and positioned to engage the serrated teeth 56 of the ratchet bar 54 and a pawl release button 74 at the other end. Pawl pins 76 extending from opposite sides of the pivoting catch 70 are received and pivotably retained in sockets (not shown) in the inwardly facing surface of the housing front plate 28 and the opposed inwardly facing surface of the support-plate sub-assembly 16. A ratchet pawl compression spring (not shown) extends between a cradle 82 and the release button 74 biasing the pawl 58 in the ratchet bar 54 engaging position such that pressing of the release button 74 disengages the catch edge 72 from the serrated teeth 56 of the ratchet bar 54 allowing movable latch-plate sub-assembly compression spring 64 to expand, thereby moving the upper mount 44 upwardly and away from the lower mount 36. The pawl 58 may be locked in place by a slideable locking pin 80

Referring to FIGS. 1-4, 8 and 24, mount 10 may have an intermediate mount 84 positioned on the housing sub-assembly 12 between the lower mount 36 and the upper mount 44 to allow mobile hand-holdable electronic devices with small frames to be reliably received and releasably retained in the mount 10. The intermediate mount 84 comprises a pair of pivotable arms 86 stowed in recesses 88 in the right and left housing side plates 22, 24. Each pivotable arm 86 has a pivotable arm pin 90 with a collapsible tip allowing the pivotable arm pin 90 to be inserted in an arm hole 92 in the right and left recesses 88 such that upon insertion in the arm hole 92, the tip is first compressed and then expands providing a snap fit pivotably attaching them pivot arm 86 to the right or left side-plate 22, 24. In some embodiments, each pivotable arm 86 may be pivotably attached to the right and left side-plates 22, 24 by a threaded pivotable arm pin screwably inserted in each arm hole 92. The total range of travel of the pair of pivotable arms 86 is about 90 degrees. At zero degrees, the pivot arms 86 are stowed in the recesses 88 in the right and left housing side plates 22, 24 and held in the stowed position by the reverse angle feature of the pivotable arms 86 in conjunction with a similar reverse angle feature of the recesses 88. In some embodiments, a finger nail slot may be provided as a feature between the pivotable arms 86 and the housing right and left side plates and the housing front plate 28.

Figure 1:
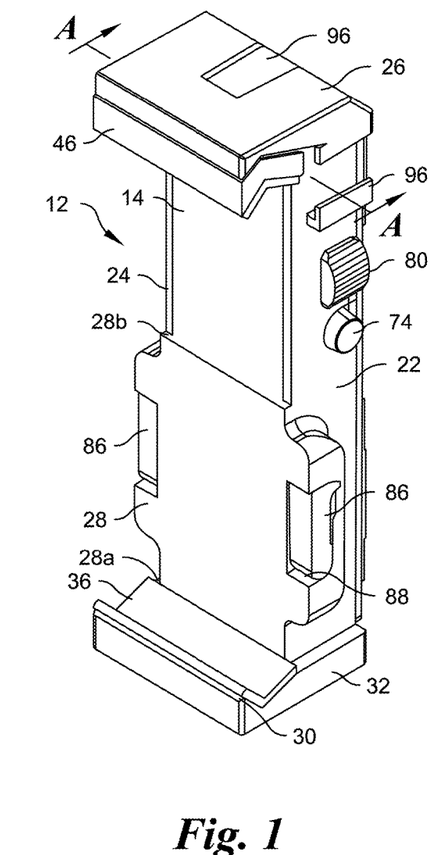
FIG. 1 is a front isometric view of a preferred embodiment of a universal mount for a mobile hand-holdable electronic device in accordance with the present invention.
Figure 2:
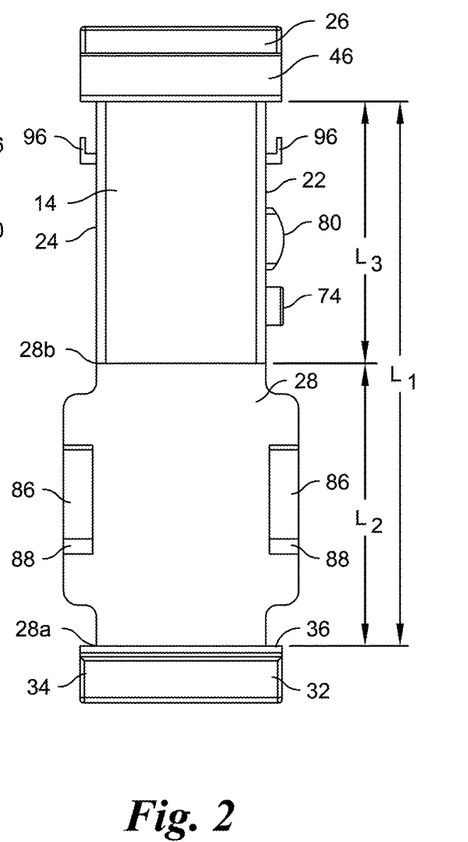
FIG. 2 is a front elevation view of the mount of FIG. 1.
Figure 3:
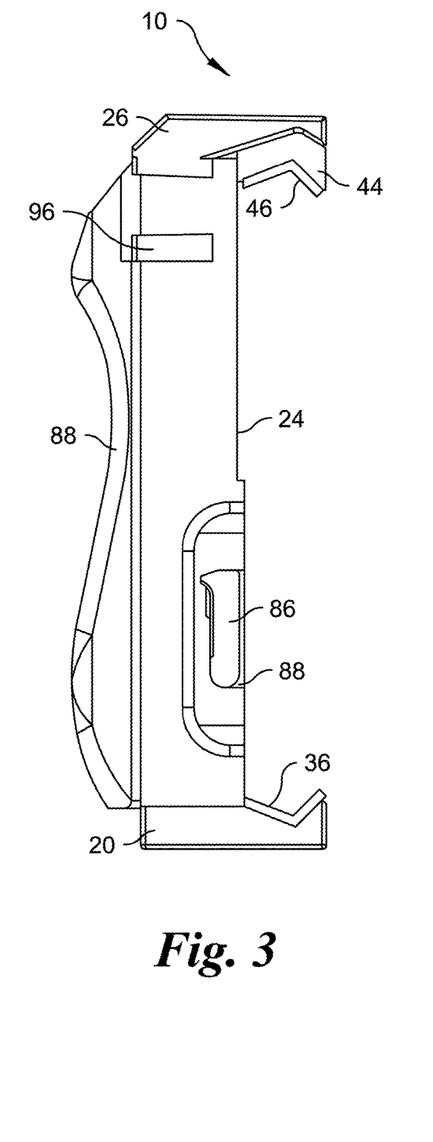
FIG. 3 is a left-side elevation view of the mount of FIG. 1.
Figure 4:
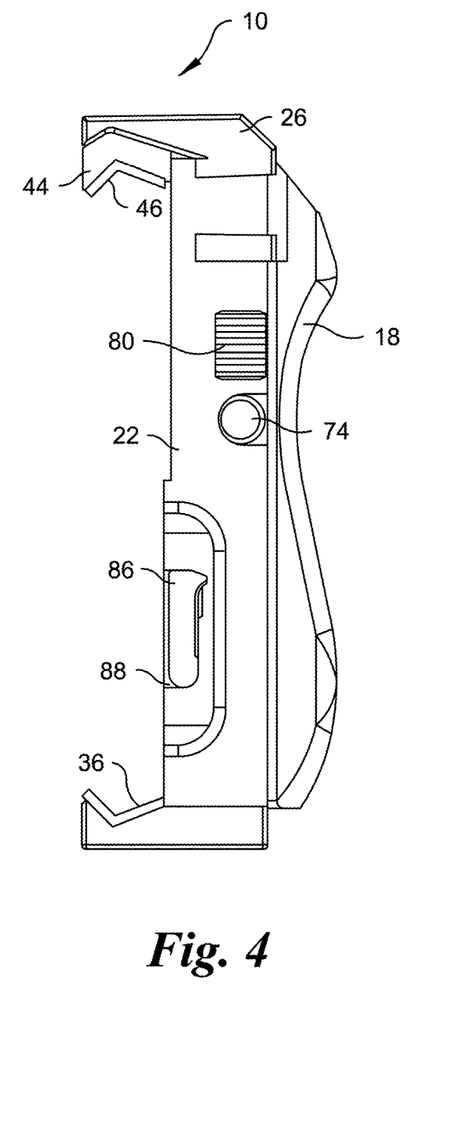
FIG. 4 is a right-side elevation view the mount of FIG. 1.
Figure 5:
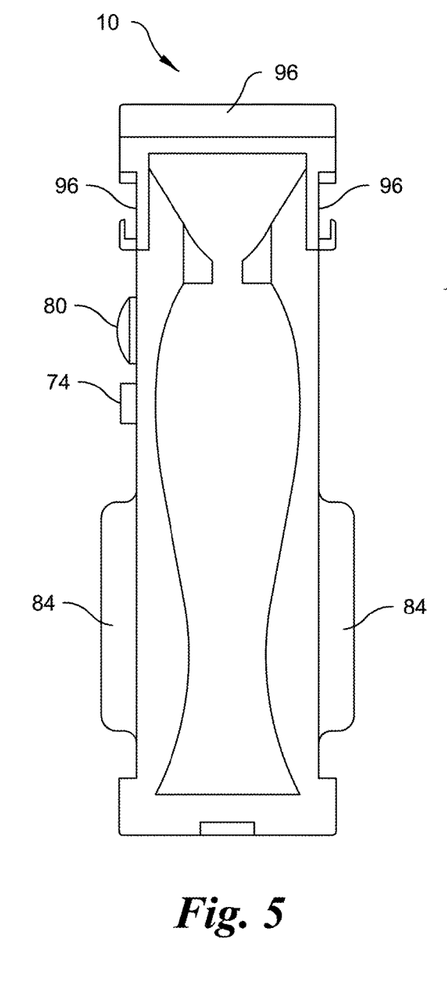
FIG. 5 is a back elevation view the mount of FIG. 1.
Figure 6:
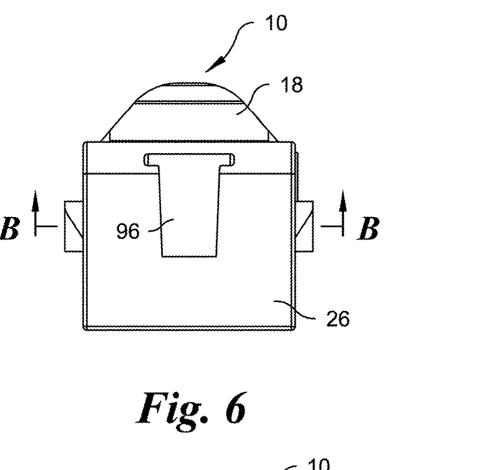
FIG. 6 is a top plan view the mount of FIG. 1.
Figure 7:
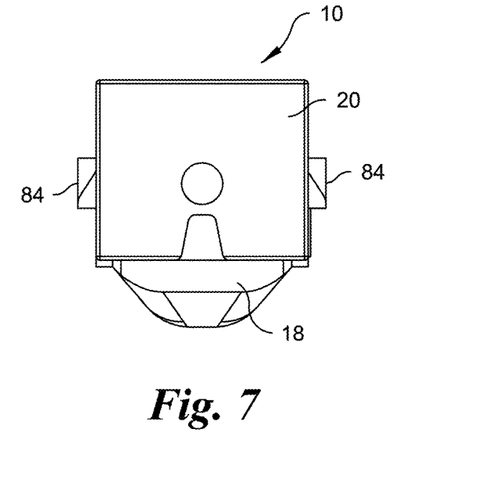
FIG. 7 is bottom plan view of the mount of FIG. 1.

Referring to FIGS. 1 and 2, in some embodiments of the mount 10, the housing sub-assembly 12 may have a cold shoe mount 96 on one or more housing sub-assembly side and top plates 22, 24, 26 for mounting peripheral devices (e.g. external lights, microphones, and the like) which enhance the functionality of the mobile device.

As stated above for the housing sub-assembly 12, the several sub-assemblies described above are preferably fabricated by well known injection molding processes from compatible polymeric materials. However, the fabrication materials are not limited to polymerics. Other materials such as various metals or carbon fiber composites could be used.

A preferred method for assembling the mount 10 includes as a first step, placing the housing sub-assembly with the housing sub-assembly 12 front plate 28 facing downwardly on a flat surface. The movable-plate sub-assembly 14 is inserted into the front of the housing sub-assembly 12 such that the latch pins 38 extending outwardly from each side of the top portion of the movable plate 36 are slideably disposed in the slots 42 in the opposed inner surfaces of the right and left housing side-plated 22, 24 and the upper mount 46 extends past the housing front-plate 28 The movably latch-plate sub-assembly compression spring 64 is installed by sliding the spring 64 over the open end of the rod 62, making sure that both ends of the spring 64 are properly seated at their interface with the rod 62 and the housing base plate 20 and that the body of the spring 64 is located properly in the movable latch-plate sub-assembly channel 60. The gear wheel 52 is now installed on the inwardly extending shaft 66 of the forwardly facing surface of the support-plate sub-assembly 16. The ratcheting pawl 58 and compression spring (not shown) are installed on the inwardly extending shaft 66 of the forwardly facing surface of the support-plate sub-assembly 16 such that one end of the compression spring (not shown) is seated in the compression spring cradle 82 and the other end is seated in the pawl release button 74. Damping grease is applied to both the gear wheel 52 and the ratcheting pawl 58 to hold the components in place while installing the support-plate sub-assembly 16 is installed on the movable latch-plate sub-assembly 14 in the housing sub-assembly 12 making sure that the pivoting catch pivot pins 76 are inserted in the pivot pin sockets (not shown) in both the housing sub-assembly 12 and the support-plate sub-assembly 16. The support-plate sub-assembly 16 is now attached to the house sub-assembly 12 by threaded fasteners. In some embodiments, the support-plate sub-assembly 16 may be additionally attached to the house sub-assembly 12 by dovetail joints, adhesive bonds or other well known joining methods.

Figures 9, 10:
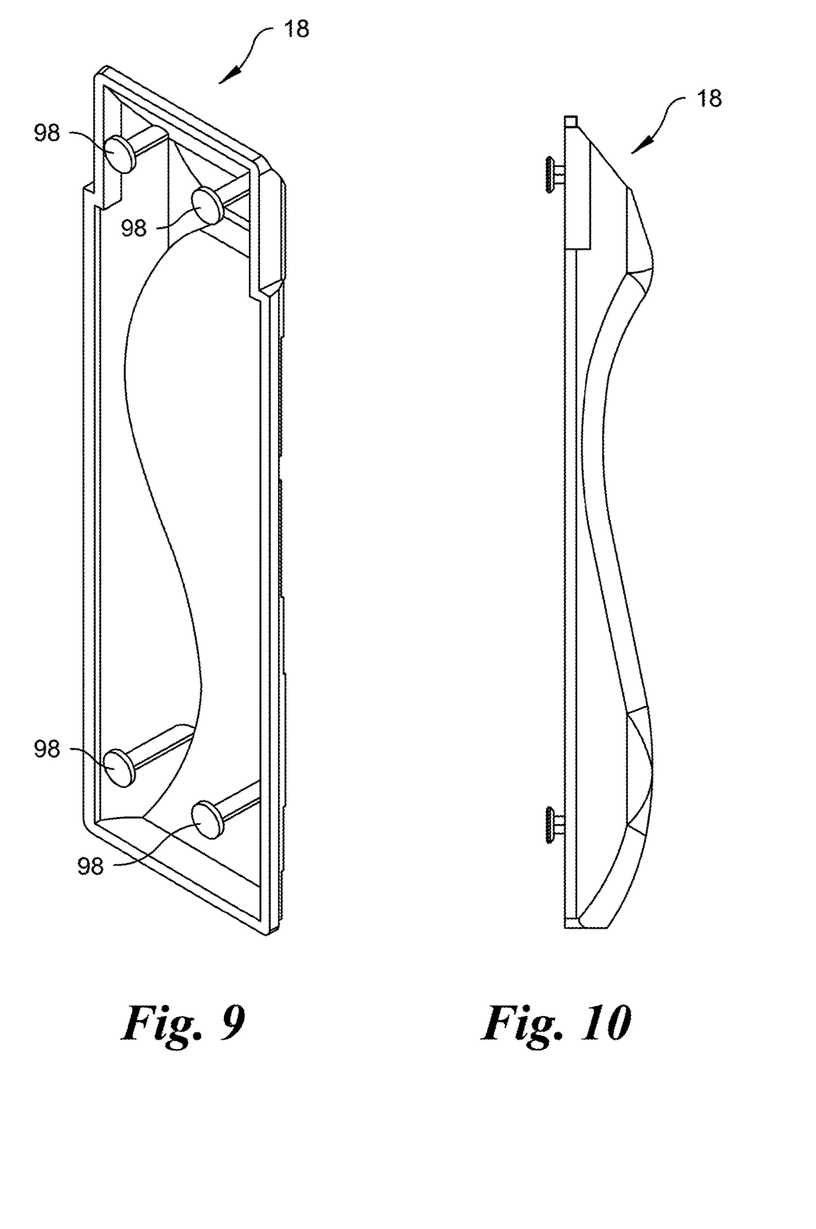
FIG. 9 is a front isometric view of the back-plate sub-assembly of the mount of FIG. 1.
FIG. 10 is a right side elevation view of the back-plate sub-assembly of the mount of FIG. 1.
Figure 11:
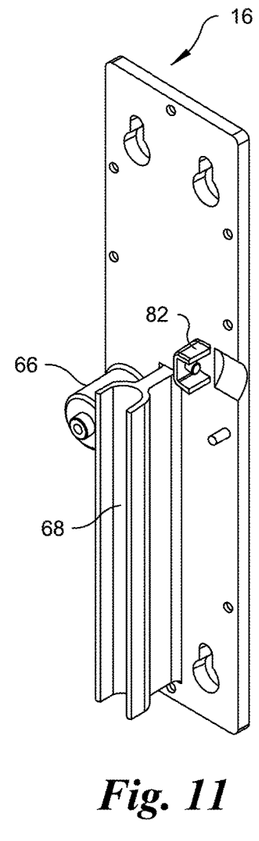
FIG. 11 is a front isometrix view of the support-plate sub-assembly of the mount of FIG. 1.
Figure 12:
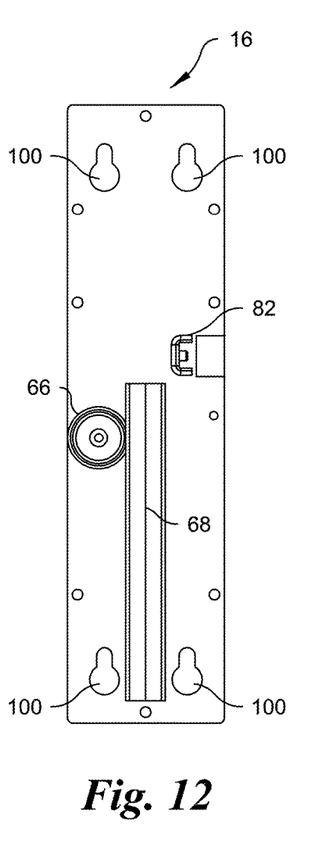
FIG. 12 is a front elevation view of support-plate sub-assembly of the mount of FIG. 1.
Figure 13:
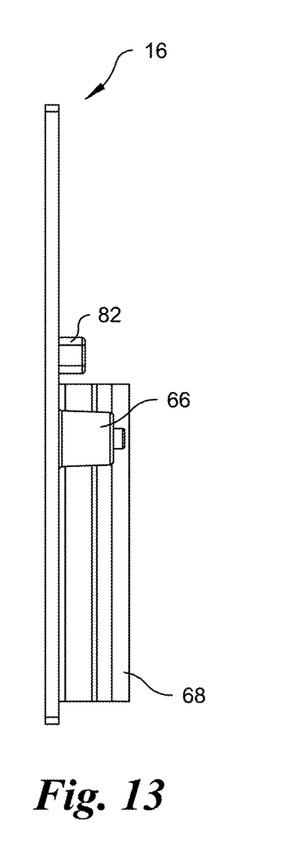
FIG. 13 a left-side elevation view of the support-plate sub-assembly of the mount of FIG. 1.
Figure 14:
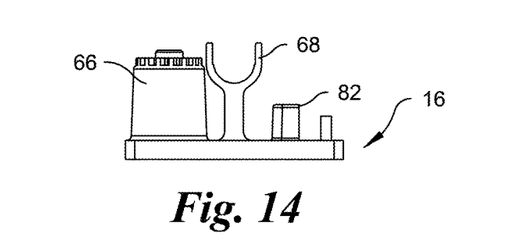
FIG. 14 is a bottom plan view of the support-plate sub-assembly of the mount of FIG. 1.
Figure 15:
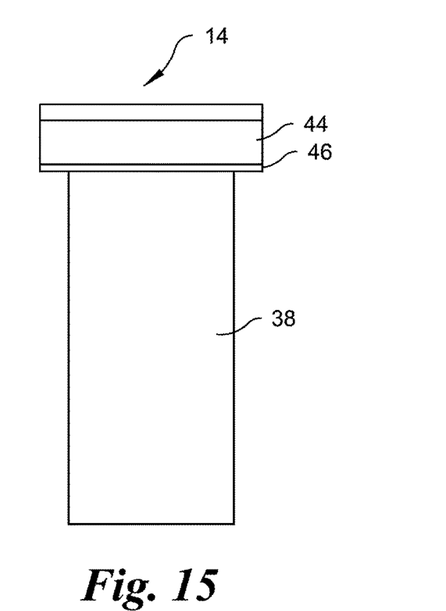
FIG. 15 is a front elevation view of the movable latch-plate sub-assembly of the mount of FIG. 1.
Figure 16:
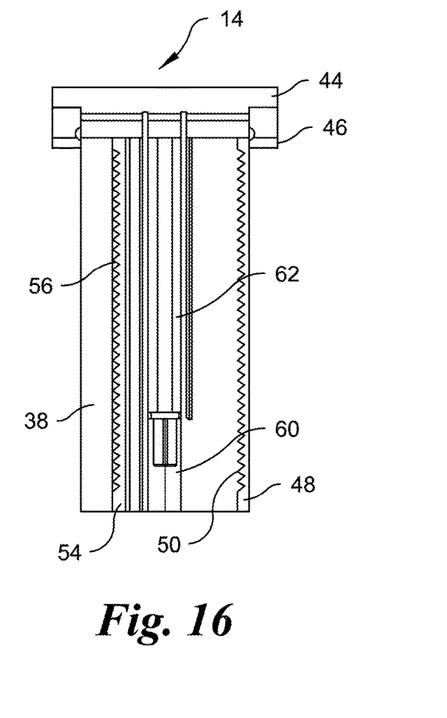
FIG. 16 is a back elevation view of the movable latch-plate sub-assembly of the mount of FIG. 1.
Figure 17:
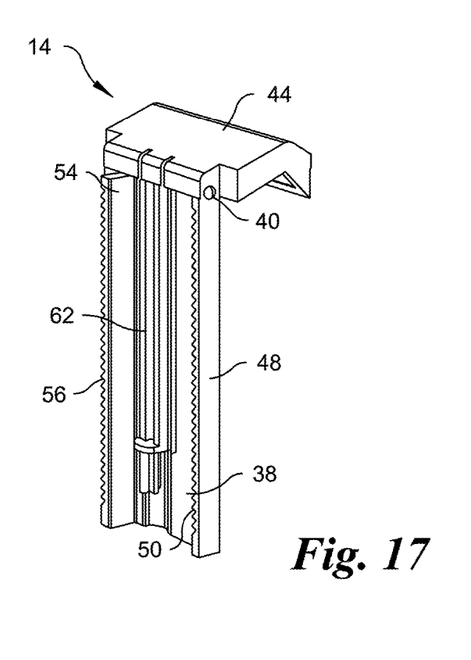
FIG. 17 is a back isometric view of the movable latch-plate sub-assembly of the mount of FIG. 1.
Figure 18:
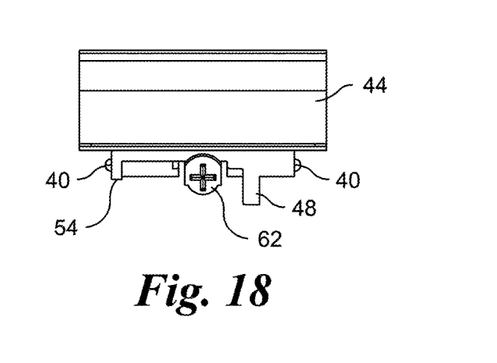
FIG. 18 is bottom plan view of the movable latch-plate sub-assembly of the mount of FIG. 1.
Figure 19:
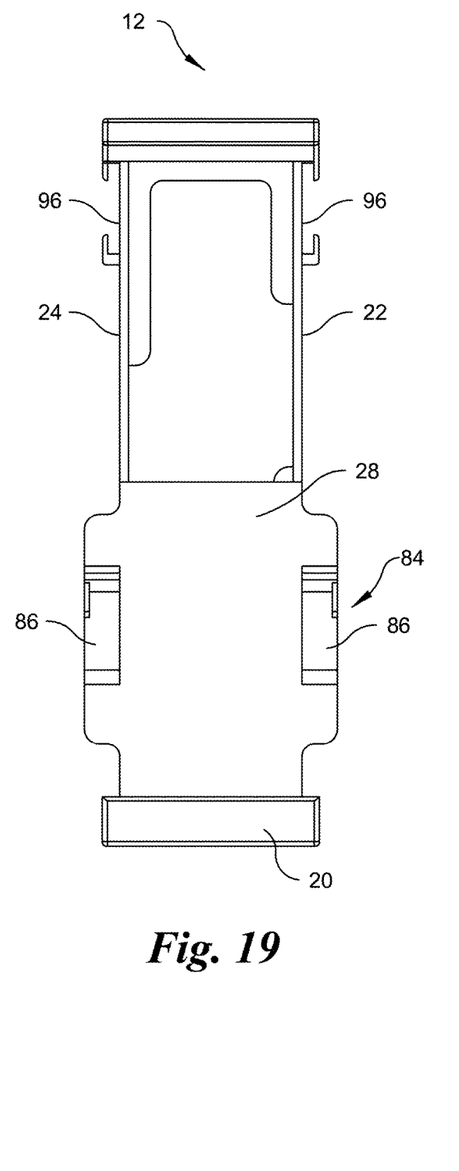
FIG. 19 is a front elevation view of the housing sub-assembly of the mount of FIG. 1.
Figure 20:
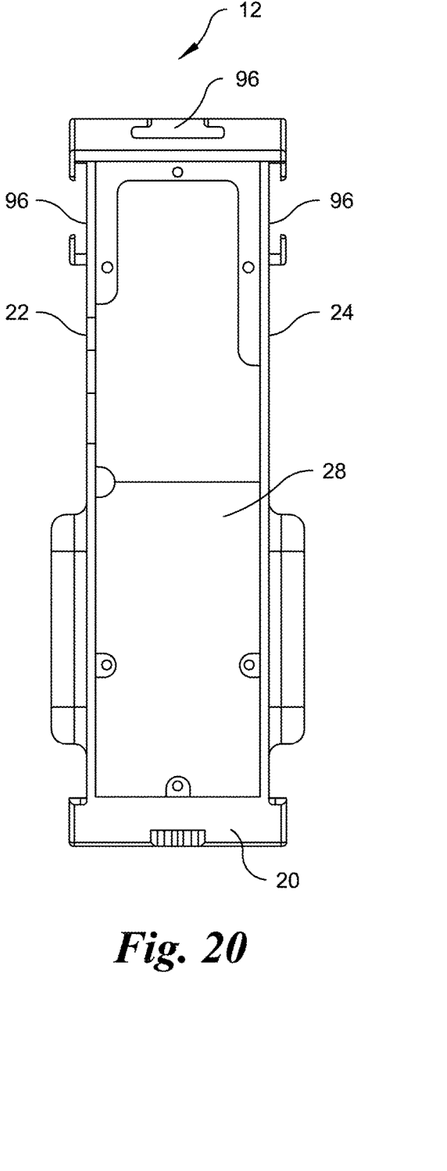
FIG. 20 is a back elevation view of the housing sub-assembly of the mount of FIG. 1.

Referring to FIGS. 8-10, the housing back-plate sub-assembly 18 has a generally rectangular shell like shape with inwardly extending flat head studs 98 positioned at each corner of the housing back-plate sub-assembly 18 for insertion in keyholes 100 in the support-plate sub-assembly 16 in register with the flat head studs 98 which upon insertion in the keyholes 100 and the upward sliding of the housing back-plate sub-assembly 18 relative to the support-plate sub-assembly 16 locks the two sub-assemblies 16, 18 together, enclosing the house sub-assembly 12.

It will be appreciated by those skilled in the art that changes could be made to the embodiment described above without departing from the presently-disclosed invention. It is understood, therefore, that this invention is not limited to the particular embodiment disclosed, but it is intended to cover modifications within the spirit and scope of the present invention as defined by the appended claim.

I claim:

1. A universal mount able to accommodate mobile hand-holdable electronic devices of various sizes having a device lower edge spaced from a device upper edge, the universal mount comprising:
   a housing sub-assembly having a housing sub-assembly base-plate with a lower mount attached thereto, the lower mount configured to releaseably receive the device lower edge;
   a movable latch-plate sub-assembly disposed in and slideably attached to the housing sub-assembly, the movable latch-plate sub-assembly having an upper mount attached thereto, the upper mount aligned with the lower mount at a position above the lower mount and configured to releaseably receive the device upper edge, the position of the upper mount being adjustable relative to the lower mount to accommodate mobile hand-holdable electronic devices of various sizes;
   a support-plate sub-assembly fixedly disposed in the housing sub-assembly, the movable latch-plate sub-assembly slideably attached to the support-plate sub-assembly; and
   a back-plate sub-assembly attached to the housing sub-assembly and enclosing the movable latch-plate sub-assembly and the support-plate sub-assembly in the housing sub-assembly,
   wherein the housing sub-assembly further comprises:
   a first housing sub-assembly side plate and a second housing sub-assembly side plate spaced from the first housing sub-assembly side plate, the first and second housing sub-assembly side plates having a length $L_1$ and extending upwardly from the housing base-plate to a housing top-plate extending from the first housing sub-assembly side plate to the second housing sub-assembly side plate;
   a housing sub-assembly front-plate extending from the first housing sub-assembly side plate to the second housing sub-assembly side plate and upwardly from the housing sub-assembly base-plate a length $L_2$ less than the length $L_1$; and
   a housing sub-assembly opening in the housing sub-assembly between the housing sub-assembly top-plate and the housing sub-assembly front-plate having a length $L_3$ within which the position of the movable-plate sub-assembly is adjustable.

2. The universal mount according to claim 1, wherein the housing sub-assembly is injection molded as a single integrated piece.

3. The universal mount according to claim 1, wherein the housing sub-assembly further comprises a cold shoe on at least one of the first housing sub-assembly side plate, the a second housing sub-assembly side plate and the housing sub-assembly top plate, the cold shoe configured to mount a peripheral device.

4. A universal mount able to accommodate mobile hand-holdable electronic devices of various sizes having a device lower edge spaced from a device upper edge, the universal mount comprising:
   a housing sub-assembly having a housing sub-assembly base-plate with a lower mount attached thereto, the lower mount configured to releaseably receive the device lower edge;
   a movable latch-plate sub-assembly disposed in and slideably attached to the housing sub-assembly, the movable latch-plate sub-assembly having an upper mount attached thereto, the upper mount aligned with the lower mount at a position above the lower mount and configured to releaseably receive the device upper edge, the position of the upper mount being adjustable relative to the lower mount to accommodate mobile hand-holdable electronic devices of various sizes;
   a support-plate sub-assembly fixedly disposed in the housing sub-assembly, the moveable latch-plate sub-assembly slideably attached to the support-plate sub-assembly; and
   a back-plate sub-assembly attached to the housing sub-assembly and enclosing the moveable latch-plate sub-assembly and the support-plate sub-assembly in the housing sub-assembly,
   wherein the movable latch-plate sub-assembly further comprises:
   a moveable latch-plate sub-assembly rail positioned along a right edge of a rearwardly facing surface of the movable latch-plate sub-assembly, the movable latch-plate sub-assembly rail extending rearwardly and configured as a rack having gear teeth on an inwardly facing rack surface; and
   wherein the support-plate sub-assembly comprises:
   a forwardly facing support-plate sub-assembly surface;
   a support-plate shaft extending inwardly from the forwardly facing support-plate sub-assembly surface, and
   a support-plate sub-assembly gear wheel rotatably mounted on the support-plate sub-assembly shaft and engaging the gear teeth of the rack on the rearwardly facing surface of the movable latch-plate sub-assembly.

5. A universal mount able to accommodate mobile hand-holdable electronic devices of various sizes having a device lower edge spaced from a device upper edge, the universal mount comprising:
   a housing sub-assembly having a housing sub-assembly base-plate with a lower mount attached thereto, the lower mount configured to releaseably receive the device lower edge;
   a movable latch-plate sub-assembly disposed in and slideably attached to the housing sub-assembly, the movable latch-plate sub-assembly having an upper mount attached thereto, the upper mount aligned with the lower mount at a position above the lower mount and configured to releaseably receive the device upper edge, the position of the upper mount being adjustable relative to the lower mount to accommodate mobile hand-holdable electronic devices of various sizes;
   a support-plate sub-assembly fixedly disposed in the housing sub-assembly, the movable latch-plate sub-assembly slideably attached to the support-plate sub-assembly; and
   a back-plate sub-assembly attached to the housing sub-assembly and enclosing the movable latch-plate sub-assembly and the support-plate sub-assembly in the housing sub-assembly;
   wherein the movable latch-plate sub-assembly comprises:
   a movable latch-plate sub-assembly bar spaced from the left edge of a rearwardly facing surface of the movable latch-plate sub-assembly, the movable latch-plate sub-assembly bar extending rearwardly and configured as a ratchet bar with serrated teeth on an outwardly facing ratchet bar surface, and wherein the support-plate sub-assembly comprises:
a support-plate sub-assembly pawl which engages the serrated teeth of the ratchet bar on the rearwardly facing surface of the latch-plate sub-assembly permitting movement of the movable latch-plate sub-assembly in one direction and preventing movement of the movable latch-plate sub-assembly in the opposite direction.

6. The universal mount according to claim 5, wherein the pawl comprises:
a pivoting catch having an catch edge at a first pawl end configured and positioned to engage the serrated teeth of the ratchet bar and a pawl release button at a second pawl end.

7. A universal mount able to accommodate mobile hand-holdable electronic devices of various sizes having a device lower edge spaced from a device upper edge, the universal mount comprising:
a housing sub-assembly having a housing sub-assembly base-plate with a lower mount attached thereto, the lower mount configured to releaseably receive the device lower edge;
a movable latch-plate sub-assembly disposed in and slideably attached to the housing sub-assembly, the moveable latch plate sub-assembly having an upper mount attached thereto, the upper mount aligned with the lower mount at a position above the lower mount and configured to releaseably receive the device upper edge, the position of the upper mount being adjustable relative to the lower mount to accommodate mobile hand-holdable electronic devices of various sizes;
a support-plate sub-assembly fixedly disposed in the housing sub-assembly, the movable latch-plate sub-assembly attached to the support-plate sub-assembly; and
a back-plate sub-assembly attached to the housing sub-assembly and enclosing the movable latch-plate sub-assembly and the support-plate sub-assembly in the housing sub-assembly;
wherein the movable latch-plate sub-assembly comprises:
a rearwardly facing movable latch-plate sub-assembly surface having a centrally-positioned downwardly-extending movable latch-plate sub-assembly first slot spaced apart from a centrally-positioned downwardly-extending movable latch-plate sub-assembly second slot; and
a movable latch-plate sub-assembly rod disposed between the movable latch-plate sub-assembly first and second spaced-apart slots, the movable latch-plate sub-assembly rod extending downwardly substantially a movable latch-plate slot length and terminating in a movable latch-plate sub-assembly rod compression spring mount, and
wherein the support-plate sub-assembly comprises:
a generally U-shaped support-plate sub-assembly channel having spaced-apart first and second channel arms slideably disposed in the movable latch-plate sub-assembly first and second spaced-apart slots;
a movable latch-plate sub-assembly compression spring disposed in the support-plate sub-assembly channel having a first compression spring end coupled to the movable latch-plate sub-assembly rod compression spring mount and a second compression spring end attached to and supported by the housing base plate, the movable latch-plate sub-assembly compression spring upwardly biasing the upper mount away from the lower mount.

8. A universal mount able to accommodate mobile hand-holdable electronic devices of various sizes having a device lower edge spaced from a device upper , the universal mount comprising:
a housing sub-assembly having a housing sub-assembly base-plate with a lower mount attached thereto, the lower mount configured to releaseably receive the device lower edge;
a movable latch-plate sub-assembly disposed in and slideably attached to the housing sub-assembly, the movable latch-plate sub-assembly having an upper mount attached thereto, the upper mount aligned with the lower mount at a position above the lower mount and configured to releaseably receive the device upper edge, the position of the upper mount being adjustable relative to the lower mount to accommodate mobile hand-holdable electronic devices of various sizes;
a support-plate sub-assembly fixedly disposed in the housing sub-assemnly, the movable latch-plate sub-assembly slideably attached to the support-plate sub-assembly; and
a back-plate sub-assembly attached to the housing sub-assembly and enclosing the movable latch-plate sub-assembly and the support-plate sub-assembly in the housing sub-assembly;
wherein the housing sub-assembly further comprises:
a first recess in the first housing sub-assembly side plate;
a second recess in the second housing sub-assembly side plate;
an intermediate mount positioned between the lower mount and the upper mount, the intermediate mount comprising:
a first extendable arm stowed in the first recess and pivotably attached to the first housing sub-assembly side plate; and
a second extendable arm stowed in the second recess and pivotably attached to the second housing sub-assembly side plate,
the first and second extendable anus are configured to releaseably receive the device lower edge when the first and second extendable arms are in an extended position.

* * * * *